(12) United States Patent
Kemp, III et al.

(10) Patent No.: US 6,169,681 B1
(45) Date of Patent: Jan. 2, 2001

(54) POWER SUPPLY TOPOLOGY TO REDUCE THE EFFECTS OF SUPPLY PUMPING

(75) Inventors: Alson R. Kemp, III, Campbell; Richard Keller, Palo Alto, both of CA (US)

(73) Assignee: Tripath Technology, Inc., Santa Clara ( * ) Notice: Under 35 U.S.C. 154(b), the term of this patent shall be extended for 0 days.

(21) Appl. No.: 09/407,004

(22) Filed: Sep. 28, 1999

Related U.S. Application Data

(60) Provisional application No. 60/122,710, filed on Mar. 3, 1999.

(51) Int. Cl.[7] .................................................... H02M 3/24
(52) U.S. Cl. ............................................. 363/98; 363/134
(58) Field of Search ................................. 363/17, 98, 132, 363/133, 134, 24, 25

(56) References Cited

U.S. PATENT DOCUMENTS

| | | | |
|---|---|---|---|
| 4,811,185 | * | 3/1989 | Cook et al. ............................. 363/17 |
| 5,117,198 | * | 5/1992 | Morenz .................................. 330/251 |
| 5,198,969 | | 3/1993 | Redl et al. ............................. 363/17 |

* cited by examiner

Primary Examiner—Peter S. Wong
Assistant Examiner—Gary L. Laxton
(74) Attorney, Agent, or Firm—Beyer Weaver & Thomas LLP

(57) ABSTRACT

A circuit is described for balancing a power supply having a positive bus with a positive voltage, and a negative bus with a negative voltage. The circuit includes a transformer having a primary winding and a secondary winding. Switching circuitry alternately connects the positive bus and the negative bus to the primary winding of the transformer thereby generating a secondary voltage of opposite polarity on the secondary winding of the transformer. Recycling circuitry is also included which is coupled to the secondary winding of the transformer and the positive and negative buses. When the secondary voltage is greater than the positive voltage, power is transferred from the negative bus to the positive bus via the transformer and the recycling circuit. When the secondary voltage is less than the negative voltage, power is transferred from the positive bus to the negative bus via the transformer and the recycling circuit.

13 Claims, 5 Drawing Sheets

POWER SUPPLY TOPOLOGY TO REDUCE THE EFFECTS OF SUPPLY PUMPING

RELATED APPLICATION DATA

The present application claims priority from U.S. Provisional Application No. 60/122,710 for POWER SUPPLY TOPOLOGY TO REDUCE THE EFFECTS OF SUPPLY PUMPING filed on Mar. 3, 1999, the entirety of which is incorporated herein by reference for all purposes.

BACKGROUND OF THE INVENTION

The present invention relates to power supplies for class D or switching amplifiers. More specifically, the present invention provides circuits and methods for reducing the effects of power supply pumping in single-ended switching amplifiers.

Power supply pumping in single-ended switching amplifiers is a phenomenon which results in an imbalance between the positive and negative rails of the power supply. Power supply pumping results from current being sent back into one or the other of the supply rail causing an increase in the magnitude of that supply rail and an imbalance between the two rails. This has a negative effect on amplifier performance, as well as enhances the potential for power supply bus runaway in which the imbalance quickly grows to destructive proportions.

A block diagram of a typical switching amplifier 100 is shown in FIG. 1. A representative schematic for an output stage 102 and filter 101 is shown in FIG. 2. Switch 102 is built around high side and low side FETs 202 and 204, respectively, and drives load 206 via a low pass filter comprising series inductor 208 and capacitor 210. Diodes 212 and 214 and capacitors 216 and 218 are part of the power supply circuitry which generates the $\pm V_{BB}$ supply rails.

When the output voltage of the switching amplifier goes negative, a current flows from ground, through load 206 and inductor 208 and into output switch 102 (as shown by the dashed arrows), alternately flowing back to either the positive or negative power supply rail depending upon which of FETs 202 and 204 is on. Under these conditions and when low side FET 204 is on, the current discharges capacitor 218. However, when high side FET 202 is on, capacitor 216 must accept the current. This charges the positive supply rail above its desired regulation voltage, continuing until high side FET 202 is turned off and low side FET 204 is turned on. Pumping of the negative supply occurs in a similar manner during positive swings of the amplifier's output voltage.

As mentioned above, this phenomenon causes undesirable fluctuation in the balance of the amplifier's power supply rails increasing the likelihood of a catastrophic power supply bus runaway and potentially degrading the output signal. One approach to balancing the supply rails of such an amplifier are described in a 1989 Motorola Semiconductor Application Note by Donald E. Pauly entitled *High Fidelity Switching Audio Amplifiers Using TMOS Power MOSFETs*, the entirety of which is incorporated herein by reference for all purposes. A schematic of the solution described is shown in FIG. 3.

A complementary pair of TMOS power MOSFETs 302 and 304 are configured in series between the $\pm V_{BB}$ supply rails and driven with the same 20 kHz square wave. If there is an imbalance between the supply rails, the square wave delivered to inductor 306 includes a net average dc component. Thus, if the magnitude of $+V_{BB}$ is higher than that of $-V_{BB}$, more energy will be stored in inductor 306 during the time MOSFET 302 is conducting than when MOSFET 304 is conducting. When MOSFET 302 turns off and MOSFET 304 turn on, the extra energy stored in inductor 306 is transferred to $-V_{BB}$ through MOSFET 304 thereby reducing the voltage on the $+V_{BB}$ rail and increasing the voltage on the $-V_{BB}$ rail. In this way, balance between the two supply rails is restored. Similarly, if the magnitude of $-V_{BB}$ is higher than that of $+V_{BB}$, the extra energy stored in inductor 306 during the conduction time of MOSFET 304 is transferred to the $+V_{BB}$ rail during the conduction time of MOSFET 302, thereby restoring balance.

A significant disadvantage of this solution is the constant circulation of current through inductor 306 and MOSFETs 302 and 304. For example, in the specific implementation discussed in the Motorola reference cited above, the current delivered to the inductor for supply voltages of ±44 volts is a ±5.5 amp triangle wave. In addition, imbalances between the supply rails may result in an additional 3.5 amps of direct current, potentially causing saturation of the inductor core. Obviously, in terms of power dissipation EMI, and device size, this solution has some drawbacks.

In view of the foregoing it is desirable to provide a technique by which the effects of power supply pumping are reduced which is not characterized by the drawbacks of previous solutions.

SUMMARY OF THE INVENTION

According to the present invention, a power supply balancing circuit is provided which maintains the balance between opposing power supply buses without dissipating an unacceptable amount of energy. Power dissipation is much lower than the solution described above because power only flows when an imbalance between the supply rails exists. According to a specific embodiment, two balancing MOSFETs are provided in series between the power supply rails. The balancing MOSFETs are alternately switched on and off so that the positive rail and the negative rail are alternately coupled to the primary of a balancing transformer. The balancing transformer is an inverting transformer thus generating an inverted signal on the secondary. Two recycling diodes are coimected in series between the power supply rails which, under balanced conditions, are reversed biased. The secondary of the balancing transformer is coupled to the junction between the two recycling diodes. Thus, when each of the rails is connected to the primary of the transformer, the voltage at the junction of the diodes is of roughly equal magnitude to the rail voltage but of opposite polarity.

When, for example, the positive rail voltage is connected to the primary of the balancing transformer through one of the balancing MOSFETs, a negative voltage of substantially the same magnitude is generated at the secondary, and thereby at the cathode of the recycling diode coupled to the negative rail (the low-side recycling diode). If the imbalance between the positive and negative rails is sufficient to cause the low-side diode to be forward biased, current flows from the positive rail "through" the balancing transformer and into the negative rail, thereby restoring balance between the two rails. An imbalance where the negative rail has a greater magnitude than the positive rail is ameliorated in a similar manner. Thus, only if the magnitude of either of the rail voltages exceeds the other by more than one diode drop will the balancing mechanism of the present invention come into play. That is, where the rails are sufficiently balanced, virtually relatively little current e.g., magnetizing current) flows in the balancing MOSFETs. According to another specific embodiment, the turns ratio of the balancing transformer is adjusted to negate the effect of he recycling diodes such that neither rail may exceed the other.

According to another embodiment of the invention, the balancing transformer is also used to provide power to low voltage power supplies. That is, the balancing transformer has at least one additional secondary winding with an appropriate turns ratio with the primary winding and rectification circuitry to a generate a low power dc bias voltage. According to various embodiments there are multiple such secondary windings and bias voltage supplies. In this way, both high power and low power supplies are consolidated into a single power supply.

According to yet another embodiment of the invention, the balancing transformer is also used to implement a control loop for controlling operation of the power supply. That is, the balancing transformer has an additional secondary winding which is galvanically isolated from the other transformer windings and which generates a feedback signal to the power supply controller. According to a specific embodiment, the feedback signal is a ratio of the rail voltages. In the embodiments discussed above in which low power bias voltages are generated from secondaries of the balancing transformer, the feedback signal is used by the power supply controller to control both the high power supply as well as the low power bias supplies, i.e., separate control loops and controllers are not required for the different supplies. Additionally, the control winding may supply power to the controller.

Thus, the present invention provides a circuit for balancing a power supply having a positive bus with a positive voltage, and a negative bus with a negative voltage. The circuit includes a transformer having a primary winding and a secondary winding. Switching circuitry alternately connects the positive bus and the negative bus to the primary winding of the transformer thereby generating a secondary voltage of opposite polarity on the secondary winding of the transformer. When the secondary voltage is greater than the positive voltage, power is transferred from the negative bus to the positive bus via the circuit. When the secondary voltage is less than the negative voltage, power is transferred from the positive bus to the negative bus via the circuit.

According to a more specific embodiment, a circuit is provided for balancing a power supply having a positive bus with a positive voltage, and a negative bus with a negative voltage. First and second switches are connected in series between the positive bus and the negative bus. First and second diodes are connected in series between the positive bus and the negative bus. The primary winding of a transformer is coupled to the first and second switches. The secondary winding of the transformer is coupled to the first and second diodes. Balancing circuitry alternately turns the first and second switches on, thereby alternately connecting the positive bus and the negative bus of the power supply to the primary winding of the transformer, and thereby generating a secondary voltage of opposite polarity on the secondary winding of the transformer. When the secondary voltage is greater than the positive voltage, power is transferred from the negative bus to the positive bus via the transformer and the first diode. When the secondary voltage is less than the negative voltage, power is transferred from the positive bus to the negative bus via the transformer and the second diode.

A further understanding of the nature and advantages of the present invention may be realized by reference to the remaining portions of the specification and the drawings.

DETAILED DESCRIPTION OF SPECIFIC EMBODIMENTS

Figure 1:
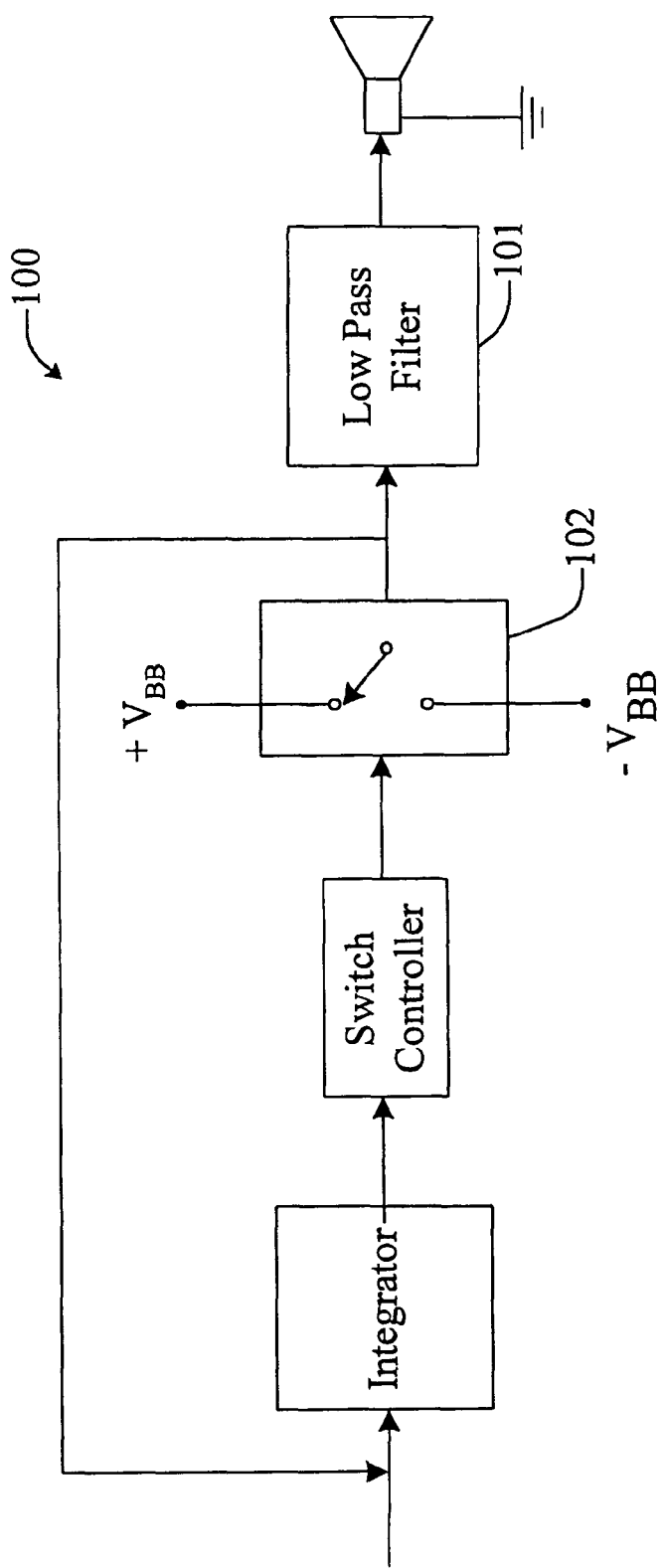
FIG. 1 is a simplified block diagram of a class D or switching amplifier.
Figure 2:
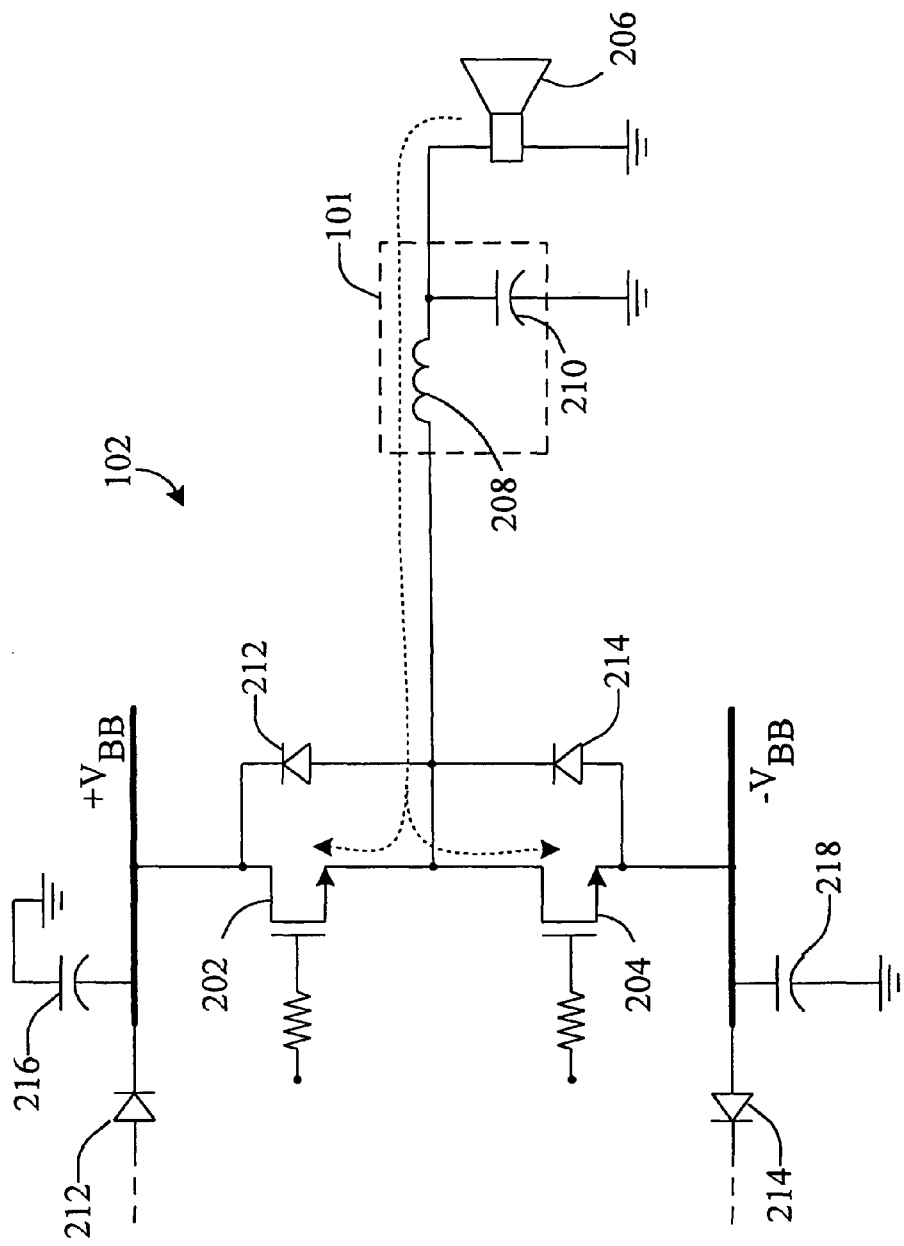
FIG. 2 is a schematic diagram of an output stage for a switching amplifier for the purpose of illustrating supply pumping.
Figure 3:
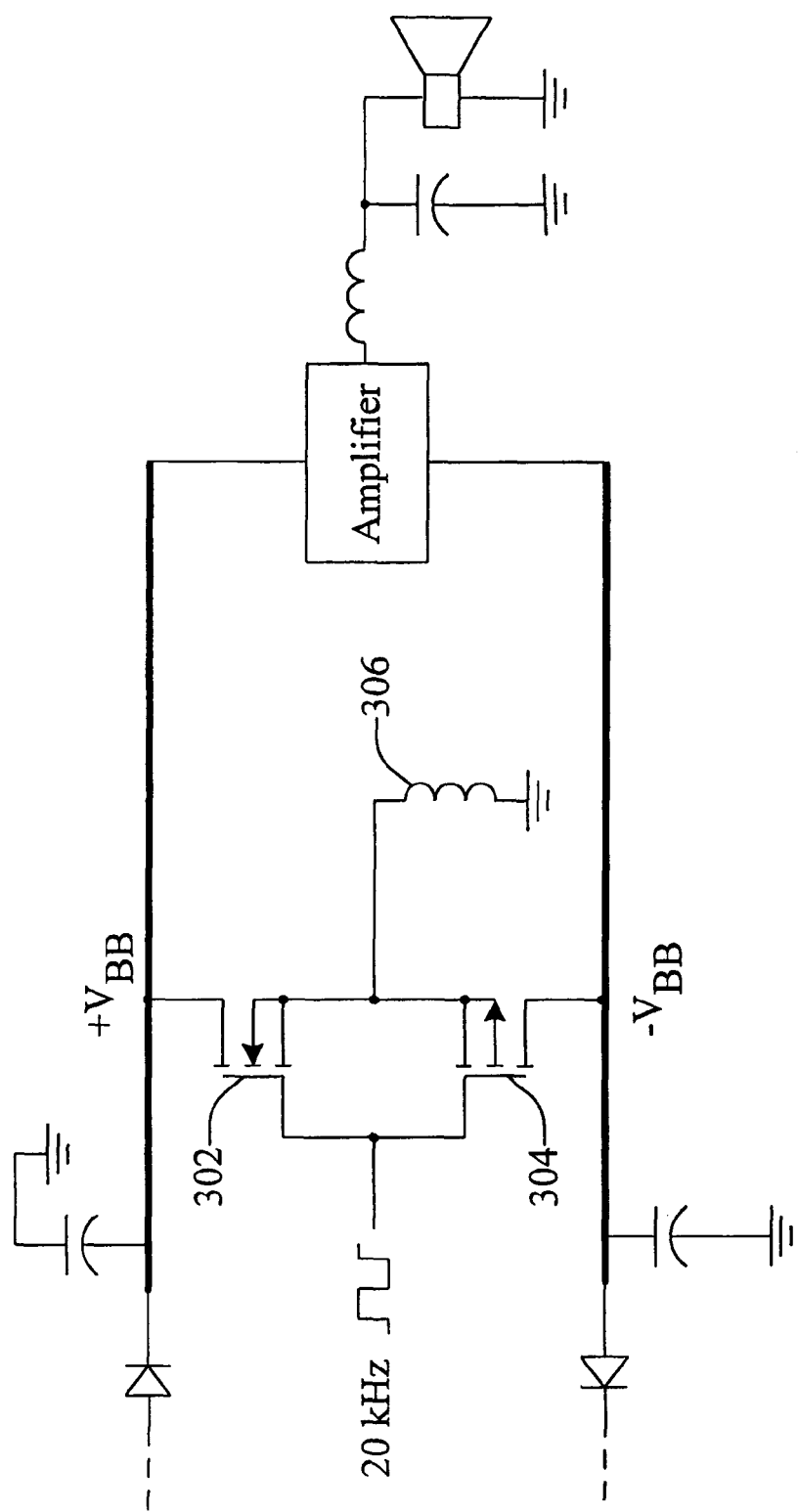
FIG. 3 is a schematic diagram of a power supply voltage balancing circuit.
Figure 4:
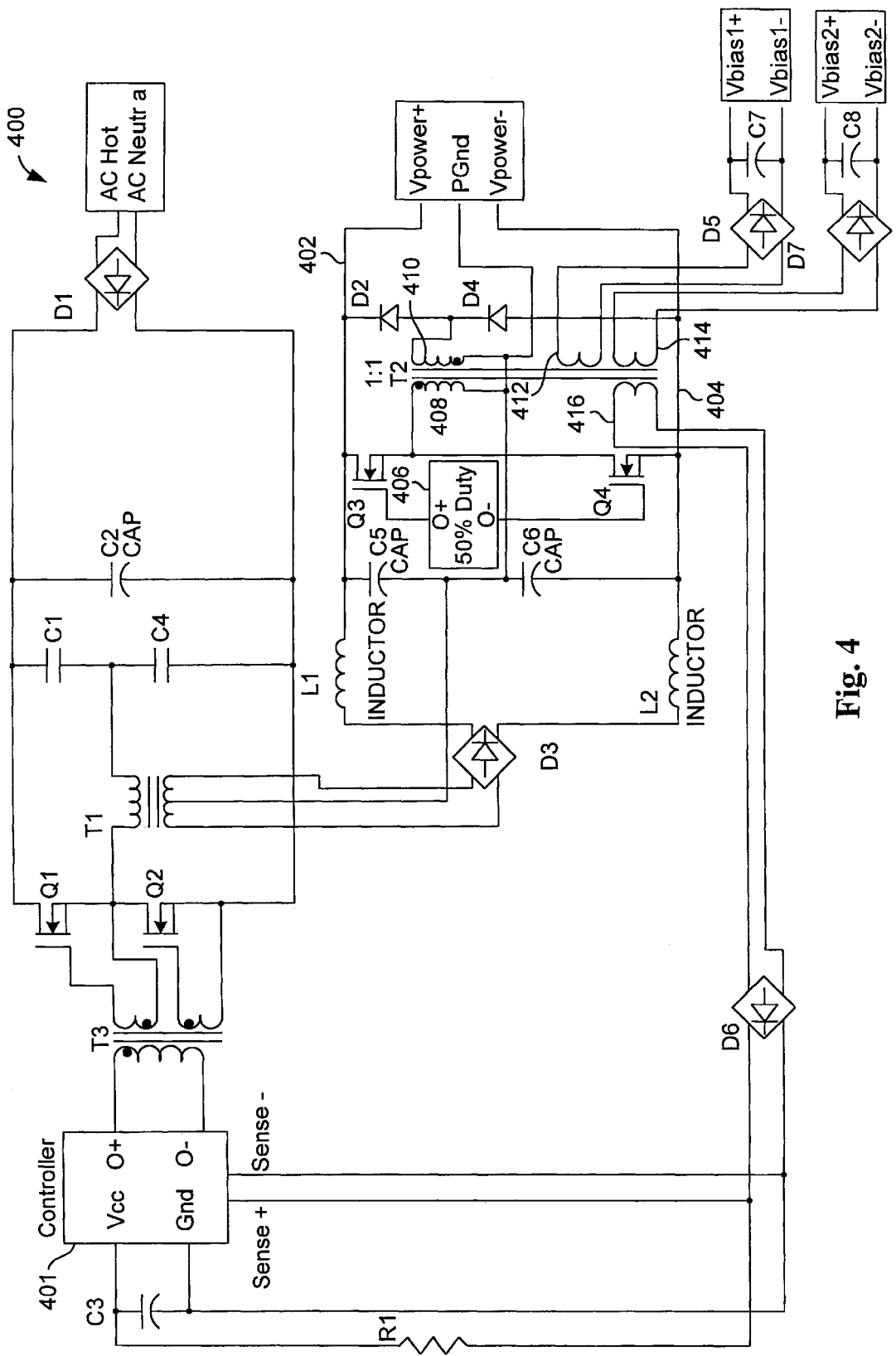
FIG. 4 is a schematic diagram of a power supply designed according to a specific embodiment of the invention.

FIG. 4 is a schematic diagram of a power supply 400 designed according to a specific embodiment of the invention. Power supply 400 combines a transformer isolated, pulse-width-modulated (PWM), high power buck power supply with two low power bias voltage supplies and a PWM controller supply. MOSFETs Q1 and Q2, transformer T1, bridge rectifier D3, inductors L1 and L2, capacitors C5 and C6, controller 401, and gate drive transformer T3 are all parts of the PWM buck power supply which provides the high power rails for power supply 400. According to a specific embodiment, the PWM buck supply portion of power supply 400 provides ±45 volts dc.

A voltage balancing circuit is provided between high power rails 402 (positive) and 404 (negative) which comprises balancing MOSFETs Q3 and Q4, a balancing transformer T2, recycling diodes D2 and D4, and balancing circuitry 406 which drives the gates of Q3 and Q4 such that each is on half the time. According to a specific embodiment, balancing circuitry 406 comprises an IR2151 from International Rectifier located in El Segundo, Calif. That is, Q3 and Q4 operate on alternating duty cycles of approximately 50%. This causes positive rail 402 and negative rail 404 to be alternately coupled to primary winding 408 of balancing transformer T2. Because secondary winding 410 of T2 is wound oppositely to primary 408 and has the same number of turns, the voltage on secondary 410 opposite in polarity and roughly equal in magnitude relative to the voltage rail currently coupled to primary 408. If the voltage on secondary 410 is ever such that either of recycling diodes D2 and D4 are forward biased, current will flow from the corresponding rail and through secondary 410, thereby transferring energy to the opposing rail via opposing current in primary 408. The conditions under which this energy transfer occurs will now be described.

Assume that the intended regulated voltages on supply rails 402 and 404 are +45 volts dc and −45 volts dc, respectively, but that supply rail 402 has been pumped to +50 volts while supply rail 404 has drooped to −40 volts. If Q4 is on, −40 volts is applied to primary 408 of T2, thereby inducing +40 volts at the secondary (and thus at the junction of recycling diodes D2 and D4). Because both of diodes D2 and D4 remain reverse biased under these conditions, no current flows in secondary 410, and no energy transfer between the supply rails occurs.

By contrast, when Q3 turns on, +50 volts is applied to primary 408, thereby inducing −50 volts on secondary 410. This causes recycling diode D4 to be forward biased relative to the −40 volts on negative rail 404 which, in turn, causes current to flow in secondary 410 and opposing current in primary 408. The net effect of this current flow is that energy is transferred from positive rail 402 to negative rail 404 through transformer T2, pulling the positive rail down and the negative rail up to within one diode drop of their regulated value, thus restoring the balance between the rails.

Similarly, assuming that supply rail 404 has been pumped up to −50 volts and supply rail 402 has drooped to +40 volts, +50 volts appears on secondary 410 when Q4 is turned on. This forward biases recycling diode D2, thereby causing a similar energy transfer phenomenon between the supply rails as described above. Thus, according to this embodiment, if the absolute value of either of the supply rails exceeds the absolute value of the other supply rail by more than one diode drop, then the rails will be "shorted" together via transformer T2, thereby transferring power between the rails and correcting the imbalance.

According to other embodiments of the invention, the "window" of power supply variation allowed by the diode drops of D2 and D4 may be eliminated so that any imbalance between the rails is immediately corrected. This may be done, for example, by controlling the turns ratio of T2 between primary 408 and secondary 410 such that the diode drop of recycling diodes D2 and D4 are negated. That is, in the embodiments described above, a 1:1 turns ratio is used. Thus, diodes D2 and D4 conduct only where the corresponding rail exceeds its regulated value by at least one diode drop. In this embodiment, however, the turns ratio is controlled to be 1:N where N is such that the magnitude of the secondary voltage will exceed the magnitude of the primary voltage by one diode drop. Thus, any imbalance between the rails causes current to flow in one of the recycling diodes.

As shown in FIG. 4 and according to a specific embodiment of the invention, transformer T2 includes secondary bias windings 412 and 414 which supply power for two low level bias voltage supplies. The signal on each of windings 412 and 414 is rectified by rectifiers D5 and D7, respectively, and held up by capacitors C7 and C8, respectively. The number of turns on each of windings 412 and 414 is set to generate the desired bias voltage at Vbias1 and Vbias2, respectively. Thus, for example, assuming that Vpower is a ±45 volt supply and that primary 408 has 15 turns, 5 turns on winding 412 results in a Vbias1 of 14 volts (taking the voltage drop through rectifier D5 into account).

Also as shown in FIG. 4 and according to another specific embodiment of the invention, transformer T2 includes secondary bias winding 416 which is galvanically isolated from the other windings of T2, and from which a feedback signal is generated for use by controller 401 in controlling the operation of power supply 400 via gate driver transformer T3. According to a specific embodiment, the signal on secondary 416 is a portion of the high power supply rail voltages ($\pm V_{BB}$) and serves a couple of purposes. After the signal is rectified by rectifier D6, it is filtered by R1 and C3 and used to provide power to controller 401. It is also used as a feedback signal to the sense connections of controller 401. This feedback configuration is possible because the embodiment of FIG. 4 operates with a substantially constant duty cycle. The configuration for a feedback circuit in the case where Q3 and Q4 do not operate with constant duty cycles will be discussed below with reference to FIG. 5.

The advantages of power supplies designed according to various embodiments of the invention are manifest. The effects of power supply pumping are alleviated without the level of power dissipation introduced by previous methods. This is due to the fact that power only flows when an imbalance between supply rails exist. In addition, a high power, multi-rail supply and low level bias voltage supplies may be consolidated into a single power supply. This serves to reduce component count and complexity, thus improving reliability. Efficiencies are realized by, for example, generating the low level bias voltages from the action of the balancing circuit.

Another advantage is realized by the use of a single control loop to regulate both the high power and bias voltage supplies. That is, instead of having independent supplies with their own control loops, a single feedback signal from the balancing transformer may be used to regulate all supply voltages. The need for an additional power supply controllers for each supply is also eliminated. Another benefit of the control feedback technique described above is that it eliminates the need for opto-isolators and other expensive and complicated feedback circuitry. Yet another advantage of the described embodiment is the manner in which the control loop provides power to controller 401.

Figure 5:
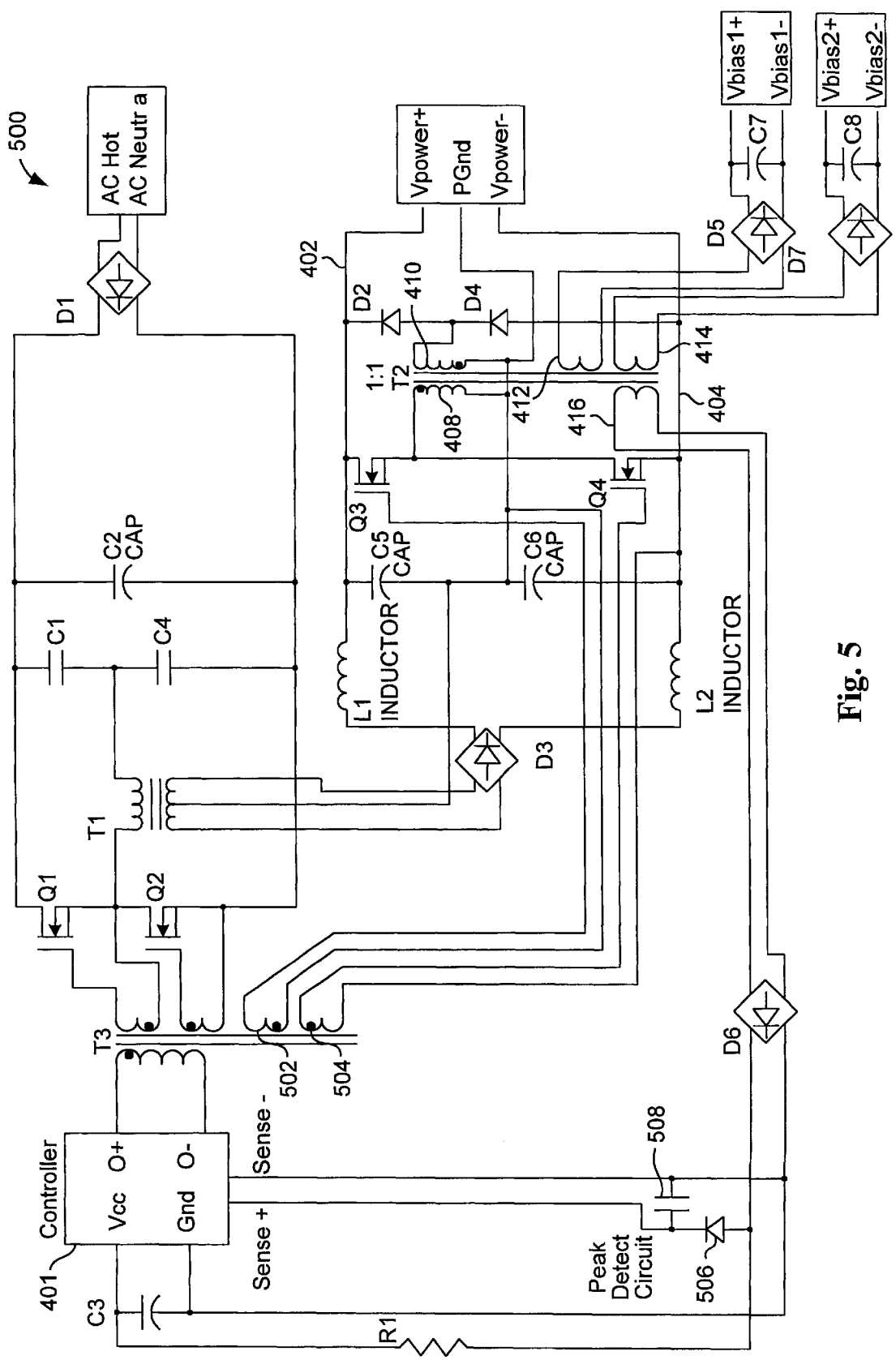
FIG. 5 is a schematic diagram of a power supply designed according to another specific embodiment of the invention.

FIG. 5 is a schematic diagram of a power supply 500 designed according to another specific embodiment of the invention. Circuit components having the same reference designations as corresponding components in power supply 400 perform the same functions as those components as described above with reference to FIG. 4. Like power supply 400, power supply 500 combines a transformer isolated, PWM, high power buck power supply with two low level bias voltage supplies, Vbias1 and Vbias2. MOSFETs Q1 and Q2, transformer T1, bridge rectifier D3, inductors L1 and L2, capacitors C5 and C6, controller 401, and gate drive transformer T3 are all parts of the PWM buck power supply which provides the high power rails for power supply 500. According to a specific embodiment, the PWM buck supply portion of power supply 500 provides ±45 volts dc.

A voltage balancing circuit is provided between high power rails 402 (positive) and 404 (negative) which comprises balancing MOSFETs Q3 and Q4, balancing transformer T2, and recycling diodes D2 and D4. However, unlike power supply 400, the drive for the gates of Q3 and Q4 is provided by secondary windings 502 and 504 on gate driver transformer T3. That is, Q3 and Q4 operate in an alternating manner, but the duty cycles may vary from the 50% duty cycles guaranteed by balancing circuitry 406 of power supply 400. Similar to supply 400, though, the alternating operation of Q3 and Q4 causes positive rail 402 and negative rail 404 to be alternately coupled to primary winding 408 of balancing transformer T2. Because secondary winding 410 of T2 is wound oppositely to primary 408 and has the same number of turns, the voltage on secondary 410 is opposite in polarity and roughly equal in magnitude relative to the voltage rail currently coupled to primary 408. If the voltage on secondary 410 is ever such that either of recycling diodes D2 and D4 are forward biased, current will flow from the corresponding rail and through secondary 410, thereby transferring energy to the opposing rail via opposing current in primary 408.

The different balancing MOSFET gate drive techniques provided in power supplies 400 and 500 have their own attendant advantages. The dedicated balancing circuitry 406 of power supply 400 guarantees a 50% duty. This allows a feedback signal to the PWM controller to be derived simply by rectifying the square wave coming off transformer T2. It also allows a simple low pass filter to filter the square wave coming off transformer T2.

With the transformer driven technique, on the other hand, the duty cycles of the balancing MOSFETs will vary. Therefore, a peak detecting feedback circuit must be used to recover the output voltage feedback signal. The feedback signal is peak detected using peak detection circuitry including diode 506 and capacitor 508.

The goal of the two different feedback techniques described with reference to FIGS. 4 and 5 is to generate a signal which accurately represents the power supply output using the square wave coming off transformer T2. If the square wave has a 50% duty cycle as in FIG. 4, the square wave can simply be averaged to provide such a feedback signal. If, on the other hand, the square wave does not have a constant duty cycle as in FIG. 5, then the average of the signal will have a dependence on the variable duty cycle and peak detection (or some equivalent technique) is used.

While the invention has been particularly shown and described with reference to specific embodiments thereof, it will be understood by those skilled in the art that changes in the form and details of the disclosed embodiments may be made without departing from the spirit or scope of the invention. For example, the embodiments described above with reference to FIGS. 4 and 5 are based on PWM buck power supplies. It will be understood, however, that the technique of the present invention may be used to alleviate the problem of power supply pumping for any of a wide variety of power supply topologies. For example, the techniques described herein may be applied to reduce the effects of supply pumping in a line frequency transformer power supply. Of course, it will be understood that in such an embodiment, feedback would not be necessary. Therefore, the scope of the invention should be determined with reference to the appended claims.

What is claimed is:

1. A circuit for balancing a power supply having a positive bus with a positive voltage, and a negative bus with a negative voltage, the circuit comprising:
    a transformer having a primary winding and a first secondary winding; and
    switching circuitry for alternately connecting the positive bus and the negative bus to the primary winding of the transformer, a primary voltage being generated on the primary winding in response thereto, a secondary voltage opposite in polarity to the primary voltage being generated on the first secondary winding in response to the primary voltage; and
    recycling circuitry coupled to the first secondary and the positive and negative buses;
    wherein when the secondary voltage is greater than the positive voltage, power is transferred from the negative bus to the positive bus via the transformer and the recycling circuitry, and when the secondary voltage is less than the negative voltage, power is transferred from the positive bus to the negative bus via the transformer and the recycling circuitry.

2. The circuit of claim 1 wherein the transformer further comprises a second secondary winding and wherein the circuit further comprises bias supply circuitry coupled to the second secondary for generating a bias voltage.

3. The circuit of claim 1 wherein the transformer further comprises a second secondary winding for generating a feedback signal, the feedback signal being for use by a power supply controller in the power supply.

4. The circuit of claim 1 wherein the switching circuitry comprises first and second switches connected in series between the positive bus and the negative bus.

5. The circuit of claim 4 wherein the first and second switches comprise MOSFETs.

6. The circuit of claim 4 further comprising gate drive circuitry for operating the first and second switches.

7. The circuit of claim 6 wherein the gate drive circuitry is operable to drive the first and second switches with alternating 50% duty cycles.

8. The circuit of claim 6 wherein the gate drive circuitry comprises second and third secondaries coupled to a gate drive transformer in the power supply.

9. The circuit of claim 1 wherein the recycling circuitry comprises first and second diodes connected in series between the positive bus and the negative bus, the secondary winding being coupled to the first and second diodes, wherein when the secondary voltage is greater than the positive voltage, power is transferred from the negative bus to the positive bus via the transformer and the first diode, and when the secondary voltage is less than the negative voltage, power is transferred from the positive bus to the negative bus via the transformer and the second diode.

10. A circuit for balancing a power supply having a positive bus with a positive voltage, and a negative bus with a negative voltage, the circuit comprising:
    first and second switches connected in series between the positive bus and the negative bus;
    first and second diodes connected in series between the positive bus and the negative bus;
    a transformer having a primary winding and a secondary winding, the primary winding being coupled to the first and second switches, the secondary winding being coupled to the first and second diodes;
    balancing circuitry for alternately turning the first and second switches on, and alternately connecting the positive bus and the negative bus of the power supply to the primary winding of the transformer, a primary voltage being generated on the primary winding in response thereto, a secondary voltage opposite in polarity to the primary voltage being generated on the secondary winding in response to the primary voltage;
    wherein when the secondary voltage is greater than the positive voltage, power is transferred from the negative bus to the positive bus via the transformer and the first diode, and when the secondary voltage is less than the negative voltage, power is transferred from the positive bus to the negative bus via the transformer and the second diode.

11. A circuit for balancing a power supply having a positive bus with a positive voltage, and a negative bus with a negative voltage, the circuit comprising:
    means for alternately connecting the positive bus and the negative bus to a primary winding of a transformer, a primary voltage being generated on the primary winding in response thereto, a secondary voltage opposite in polarity to the primary voltage being generated on a secondary winding in response to the primary voltage;
    means for transferring power from the negative bus to the positive bus where the secondary voltage is greater than the positive voltage; and
    means for transferring power from the positive bus to the negative bus where the secondary voltage is less than the negative voltage.

12. A power supply, comprising:
    a positive bus with a positive voltage;
    a negative bus with a negative voltage; and
    a circuit for balancing the positive and negative voltages, the circuit comprising:
        a transformer having a primary winding and a secondary winding;
        switching circuitry for alternately connecting the positive bus and the negative bus to the primary winding of the transformer, a primary voltage being generated on the primary winding in response thereto, a secondary voltage opposite in polarity to the primary voltage being generated on the secondary winding in response to the primary voltage; and recycling circuitry coupled to the first secondary and the positive and negative buses;

wherein when the secondary voltage is greater than the positive voltage, power is transferred from the negative bus to the positive bus via the transformer and the recycling circuitry, and when the secondary voltage is less than the negative voltage, power is transferred from the positive bus to the negative bus via the transformer and the recycling circuitry.

13. A method for balancing a power supply having a positive bus with a positive voltage, and a negative bus with a negative voltage, the method comprising:

alternately connecting the positive bus and the negative bus to a primary winding of a transformer, a primary voltage being generated on the primary winding in response thereto, a secondary voltage opposite in polarity to the primary voltage being generated on a secondary winding in response to the primary voltage;

where the secondary voltage is greater than the positive voltage, transferring power from the negative bus to the positive bus via the transformer; and where the secondary voltage is less than the negative voltage, transferring power from the positive bus to the negative bus via the transformer.

* * * * *